United States Patent
Yamada et al.

(10) Patent No.: US 6,566,162 B2
(45) Date of Patent: May 20, 2003

(54) METHOD OF PRODUCING CU (IN, GA) (SE, S) 2 SEMICONDUCTOR FILM

(75) Inventors: Akimasa Yamada, Tsukuba (JP); Shigeru Niki, Tsukuba (JP); Paul Fons, Tsukuba (JP); Kakuya Iwata, Tsukuba (JP)

(73) Assignee: National Institute of Advanced Industrial Science and Technology (JP)

(*) Notice: Subject to any disclaimer, the term of this patent is extended or adjusted under 35 U.S.C. 154(b) by 0 days.

(21) Appl. No.: 10/096,668

(22) Filed: Mar. 14, 2002

(65) Prior Publication Data
US 2002/0160539 A1 Oct. 31, 2002

(30) Foreign Application Priority Data

Apr. 27, 2001 (JP) ..................................... 2001-130893

(51) Int. Cl.$^7$ .............................................. H01L 21/20
(52) U.S. Cl. ........................ 438/95; 438/104; 438/767; 438/930
(58) Field of Search ........................ 438/84, 95, 104, 438/767, 930; 257/43

(56) References Cited

U.S. PATENT DOCUMENTS

| 4,559,282 A | * | 12/1985 | Cahen et al. ................. 429/111 |
| 6,259,016 B1 | * | 7/2001 | Negami et al. .............. 136/265 |
| 6,429,369 B1 | * | 8/2002 | Tober et al. ................. 136/265 |
| 2002/0106873 A1 | * | 8/2002 | Beck et al. .................. 438/482 |

FOREIGN PATENT DOCUMENTS

JP    4-127483 A    *    4/1992   ............ H01L/31/04

* cited by examiner

Primary Examiner—Carl Whitehead, Jr.
Assistant Examiner—Stephen W. Smoot
(74) Attorney, Agent, or Firm—Lorusso, Loud & Kelly

(57) ABSTRACT

A method of producing a semiconductor film of $Cu(M_{III})(M_{VI})_2$ wherein $M_{III}$ represents $In_{1-x}Ga_x$ where x is between 0 and 1 and $M_{VI}$ represents $Se_yS_{1-y}$ where y is between 0.5 and 1, including the steps of:

(a) depositing on a substrate a precursor $Cu(M_{III})(M_{VI})_2$ film having a molar ratio of $Cu:M_{III}$ of less than 1.0:1.0 but not less than 1.0:1.4 and (b) annealing the precursor film at a temperature of 400–500° C. in an oxygen-containing atmosphere to form a buffer layer of indium oxide and/or gallium oxide and a $Cu(In_{1-x}Ga_x)(Se_yS_{1-y})_2$ film interposed between the substrate and the buffer layer. The buffer layer may be removed by etching with an acid.

7 Claims, 7 Drawing Sheets

10 μm
as-grown

10 μm
oxygen-annealed

METHOD OF PRODUCING CU (IN, GA) (SE, S) 2 SEMICONDUCTOR FILM

CROSS-REFERENCE TO RELATED APPLICATIONS

The application claims, under 35 USC 119, priority of Japanese Application No. 2001-130893 filed Apr. 27, 2001.

BACKGROUND OF THE INVENTION

This invention relates to a method of producing a $Cu(In,Ga)(Se,S)_2$ semiconductor film, and a semiconductor film obtained by such a method. The present invention is also directed to a photovoltaic device having the above semiconductor film.

Thin-films of $CuInSe_2$ (CIS), $CuGaSe_2$ (CGS), $Cu(In_{1-x}Ga_x)Se_2$ (CIGS) and $Cu(In_{1-x}Ga_x)(Se_yS_{1-y})_2$ (CIGSS), all of which are generically referred to as $Cu(In,Ga)(Se,S)_2$, have been attracted much attention as a light absorbing film for use in photovoltaic devices or solar cells in recent years. While CIS which is a direct transition semiconductor has much greater absorption efficiency as compared with Si-type indirect transition semiconductors, the bandgap is relatively small. CIGS, in which part of indium is substituted by gallium, or CIGSS in which part of selenium of CIGS is substituted by sulfur, exhibit increased bandgaps.

In order to produce solar cells having uniform characteristics, it is necessary to control the composition of the multicomponent elements. However, because of resemblance in phase diagram of multicomponent compounds, it is very difficult to obtain desired $Cu(In,Ga)(Se,S)_2$ with reproducibile quality from run to run. The following methods have been adopted to obtain $Cu(In,Ga)(Se,S)_2$ films.

Namely, a method is known in which Cu is used in a stoichiometrically excess amount. This method has a problem because a separate phase of a Cu—Se compound is additionally formed.

A method in which (In,Ga) is used in excess is also known. While this method can form a single phase product, Cu/(In,Ga) is not 1:1, so that satisfactory conversion efficiency is not obtainable.

A method is further known in which Cu is first fed in an excess amount and (In,Ga) is then fed in an excess amount. While this method is superior to the above two methods, it is still difficult to obtain $Cu(In,Ga)(Se,S)_2$ films with consistent compositions.

SUMMARY OF THE INVENTION

Accordingly, it is a general object of this invention to provide a method which can produce a better quality $Cu(In,Ga)(Se,S)_2$ thin film more consistently and more predictably than known methods.

In accordance with the present invention, there is provided a method of producing a semiconductor film of $Cu(M_{III})(M_{VI})_2$ wherein $M_{III}$ represents $In_{1-x}Ga_x$ where x is between 0 and 1 and $M_{VI}$ represents $Se_yS_{1-y}$ where y is between 0.5 and 1, comprising the steps of:

(a) depositing on a substrate a precursor $Cu(M_{III})(M_{VI})_2$ film having a molar ratio of $Cu:M_{III}$ of less than 1.0:1.0 but not less than 1.0:1.4 and (b) annealing said precursor film at a temperature of 400–500° C. in an oxygen-containing atmosphere to form a buffer layer of indium oxide and/or gallium oxide and a $Cu(In_{1-x}Ga_x)(Se_yS_{1-y})_2$ film interposed between said substrate and said buffer layer.

The buffer layer may be removed to leave the $Cu(In_{1-x}Ga_x)(Se_yS_{1-y})_2$ film on the substrate.

The present invention also provides a semiconductor film of $Cu(In_{1-x}Ga_x)(Se_yS_{1-y})_2$ obtained by the above method.

The present invention further provides a photovoltaic device having the above semiconductor film.

BRIEF DESCRIPTION OF DRAWINGS

Other objects, features and advantages of the present invention will become apparent from the detailed description of the present invention which follows, when considered in light of the accompanying drawings, in which.

DETAILED DESCRIPTION OF THE PREFERRED EMBODIMENTS OF THE INVENTION

Figure 1:
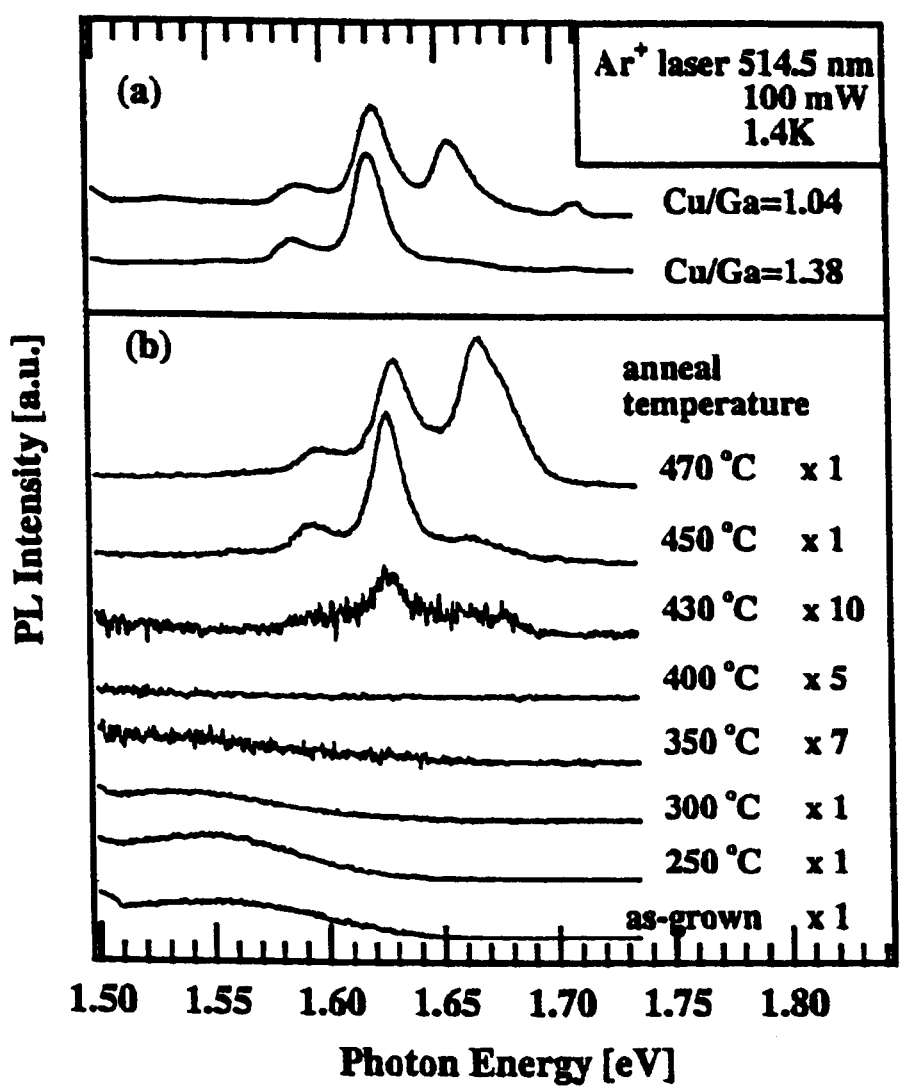
FIG. 1 shows phosphorescent spectra of a CGS precursor film annealed at various temperatures.

The present invention provides a method of producing a semiconductor film of $Cu(M_{III})(M_{VI})_2$ wherein $M_{III}$ represents $In_{1-x}Ga_x$ where x is between 0 and 1 and $M_{VI}$ represents $Se_yS_{1-y}$ where y is between 0.5 and 1.

The first step of a method of this invention is to deposit or grow a precursor $Cu(M_{III})(M_{VI})_2$ film on a substrate.

The substrate may be any conventionally employed substrate, such as a single crystal substrate, e.g. GaAs, or a glass substrate, e.g. soda lime glass. An electrode such as a molybdenum film may be formed on a surface of the substrate.

The film formation may be carried out using any suitable known method as long as the film thus formed on the substrate has a molar ratio of $Cu:M_{III}$ of less than 1.0:1.0 but not less than 1.0:1.4, preferably not less than 1.0:1.3.

Examples of such film depositing or growing method includes molecular beam epitaxy, multi-source elemental evaporation, chemical vapor deposition, metal organic chemical vapor deposition, plasma chemical vapor deposition, sputter deposition, ionized deposition, metal organic vapor phase epitaxy, pulsed layer deposition, liquid phase epitaxy, sol-gel method or slusher.

In the case of molecular beam epitaxy or multi-source elemental evaporation, the film formation is carried out using a gas containing (i) a source of copper, (ii) a source of at least one Group III element ($M_{III}$) selected from indium and gallium and (iii) a stoichiometrically excess amount of a source of a Group VI element ($M_{VI}$) selected from selenium and a mixture of selenium and sulfur.

A source of copper may be Cu or a compound thereof such as $Cu(ClO_3)_2$. A source of indium may be In or a compound thereof. A source of gallium may be Ga or a compound thereof such as $(CH_3)_3Ga$. A source of selenium may be Se or a compound thereof such as $H_2Se$. A source of sulfur may be S or a compound thereof such as $H_2S$.

For the formation of the semiconductor film, the substrate is placed in a growing chamber and is contacted with a gas containing a Cu source, a $M_{VI}$ source and a $M_{III}$ source under film forming conditions including, for example, a temperature of 450–500° C. and a high vacuum. The conditions vary with the film forming method employed. The metal sources may be fed, in the form of gases, from storage vessels or cells to the growing chamber through gas passages provided with shutters or valves for controlling the flow rates. Alternatively, the metal sources in the form of solids may be placed in the growing chamber and evaporated for contact with the substrate.

In the case of molecular beam epitaxy, respective metal sources are contained in cells and maintained at high temperatures to form vapors metal atoms or metal compound molecules. The vapors are collided against a surface of the substrate contained in the growing chamber to form and grow a film at a rate of, for example, 0.1–1 μm/hour. The molecular beams of the Cu and $M_{III}$ sources are controlled while feeding the $M_{VI}$ source at a predetermined rate.

In the case of multi-source elemental evaporation, respective sources are heated under vacuum and evaporated. The evaporated sources are contacted with a heated substrate to form and grow a film under conditions similar to the above conditions.

In the case of a gas phase method such as multi-source elemental evaporation and molecular beam epitaxy, the $M_{VI}$ source, $M_{III}$ source and Cu source are preferably used in amounts providing an atomic ratio ($M_{VI}$/Cu ratio) of at least 150:1, preferably at least 300:1. Generally, the copper source the $M_{III}$ source are used in amounts providing an atomic ratio ($M_{III}$/Cu ratio) of $M_{III}$ to Cu of 1:1.3 to 1.4:1.

In the method of the present invention, the thus obtained precursor film generally having Cu:$M_{III}$:$M_{VI}$ of 1.0:1.0:2.0 to 1.0:1.4:2.0 is then annealed at a temperature of 400–500° C., preferably 450–470° C., in an oxygen-containing atmosphere for a period of time sufficient to form a buffer layer of indium oxide and/or gallium oxide and a $Cu(In_{1-x}Ga_x)(Se_yS_{1-y})_2$ film interposed between the substrate and the buffer layer.

Figure 5:
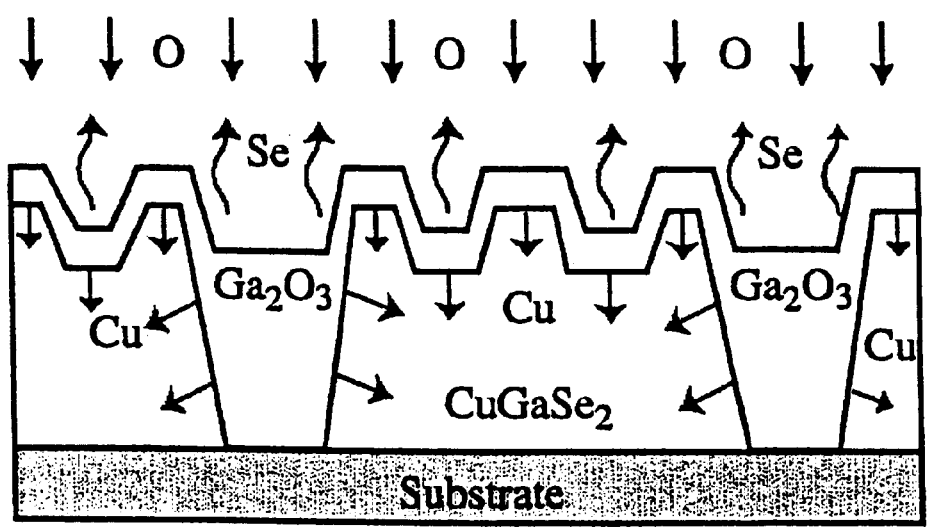
FIG. 5 is a cross-sectional schematic illustration of the annealed film.

Although not wishing to be bound by the theory, the annealing is considered to proceed according to the following mechanism. Reference should be made to FIG. 5 being a schematic cross-sectional illustration of a precursor film of, in the illustrated embodiment, Ga-excess $CuGaSe_2$. Upon oxygen annealing, the following reaction proceeds:

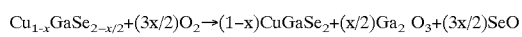

Namely, Se atoms are bonded with O atoms on a surface of the film to form SeO which is liberated from the film as a gas phase. Oxygen atoms intrude into the film from surfaces thereof and are bound by Ga to form $Ga_2O_3$ buffer layers.

The formation of the $Ga_2O_3$ layers causes liberation of Cu atoms. The liberated Cu atoms diffuse in the Ga-excess $CuGaSe_2$ so that the Ga-excess $CuGaSe_2$ gradually approaches stoichiometric $CuGaSe_2$. In the case of In, annealing results in the formation of indium oxide.

The annealing may be carried out by irradiating the precursor film with oxygen beam in a growing chamber in which the precursor film has been prepared. In this case, the oxygen may be introduced into the growing chamber before the completion of the formation of the precursor film. The annealing may also be carried out in a separately provided treatment chamber. If desired, the formation of the precursor film and annealing thereof may be repeated alternately. The annealing may be performed in an ambient pressure and in an oxygen-containing atmosphere, such as oxygen or a mixed gas of oxygen and argon.

The buffer layer or layers of gallium oxide and/or indium oxide produced by the annealing and formed on surfaces of the stoichiometric $Cu(In_{1-x}Ga_x)(Se_yS_{1-y})_2$ layer may be removed by etching with an acid such as sulfuric acid. The etching may be generally performed at room temperature or at an elevated temperature for 30 seconds to 2 minutes.

According to the present invention, it is no longer necessary to strictly control the composition of the raw material feeds or fluxes. Since the $Cu(In_{1-x}Ga_x)(Se_yS_{1-y})_2$ phase produced has a composition close to the stoichiometric composition, the electric and optical characteristics thereof are comparable to those of the stoichiometric $Cu(In_{1-x}Ga_x)(Se_yS_{1-y})_2$ film. Further, since the formation of the precursor film can reach equilibrium, the control of the film-forming reaction is easy. The gallium oxide and indium oxide has a high electric resistance, there is no fear of short circuit. The annealed product may be used as such for tunnel junctions without removing the oxide layers. In addition, the gallium oxide and indium oxide has a high bandgap (4.8 V in the case of gallium oxide) and is of an n-type, it is possible to form p-n junctions with a p-type absorbing layer.

Figure 7:
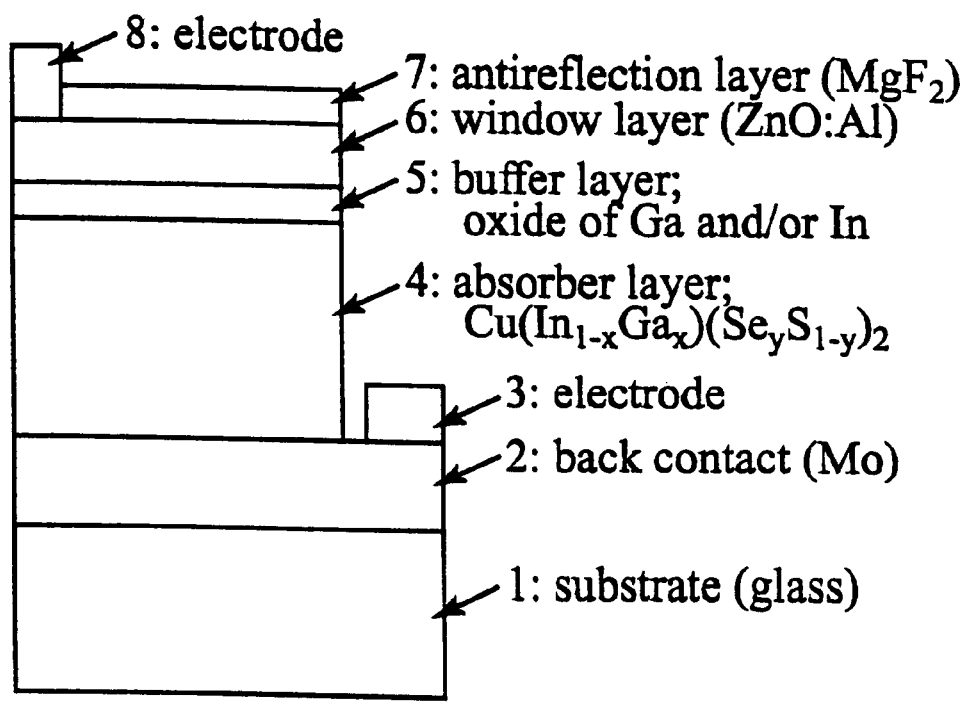
FIG. 7 is a schematic illustration of a solar cell.

FIG. 7 is a cross-sectional illustration of a solar cell provided with an absorber layer 4 of a $Cu(In_{1-x}Ga_x)(Se_yS_{1-y})_2$ thin film (CIS, CGS, CIGS or CIGSS) The solar cell has a substrate 1 (GaAs, glass substrate), a back contact 2 (Mo (used when the substrate is glass)), an electrode 3, a buffer layer 5 ($Ga_2O_3$ and/or $In_2O_3$), a transparent conductive film 6 (ITO (indium-tin oxide alloy) or Group III metal-doped ZnO), a reflection preventing film 7 ($MgF_2$) and an electrode 8.

The following examples will further illustrate the present invention.

EXAMPLE 1

Formation of CGS Precursor Film by Molecular Beam Epitaxy:

In separate vessels, Cu, Ga and Se metals were separately filled and heated to form Cu, Ga and Se gases. Each of the vessels was connected through a shutter to a growing chamber in which a GaAs substrate was disposed and heated at 460° C. While controlling the feed rates of the Cu, Ga and Se gases by the shutters such that the atomic ratio of Cu:Ga:Se was maintained at 1.2:1:200, the Cu, Ga and Se gases were fed to the growing chamber to form a CGS precursor film on the substrate. The CGS precursor film was found to have a molar ratio of Cu:Ga:Se of 0.85:1.0:2.0.

EXAMPLE 2

Annealing of Precursor Film:

The CGS precursor film was annealed in an oxygen atmosphere at various temperatures. The phosphorescent spectra of the CGS film at annealing temperatures of 250°

C., 300° C., 350° C., 400° C., 450° C. and 470° C. are shown in FIG. 1. The phosphorescent analysis was conducted with a Fourier transformation spectrometer using Ar$^+$ laser (wavelength: 514.5 nm) as excitation light and a Si detector. The sample temperature was 1.4K.

PL spectra of Ga-rich CuGaSe$_2$ films which were grown to Ga-rich composition ([Cu]/[Ga]=0.85) and then annealed in oxygen atmosphere are shown as a function of annealing temperature in FIG. 1, where PL spectra of stoichiometric CuGaSe$_2$ films grown under Cu-rich conditions ([Cu]/[Ga]= 1.04, 1.38) are also shown for comparison. The PL spectra of the Ga-rich films changed when annealed above 430° C. The PL spectra of Ga-rich films annealed at 450° C. or 470° C. became strikingly similar to PL spectra of the films grown under Cu-rich conditions, indicating that the film composition became close to the CuGaSe$_2$ stoichiometry.

Figure 2:
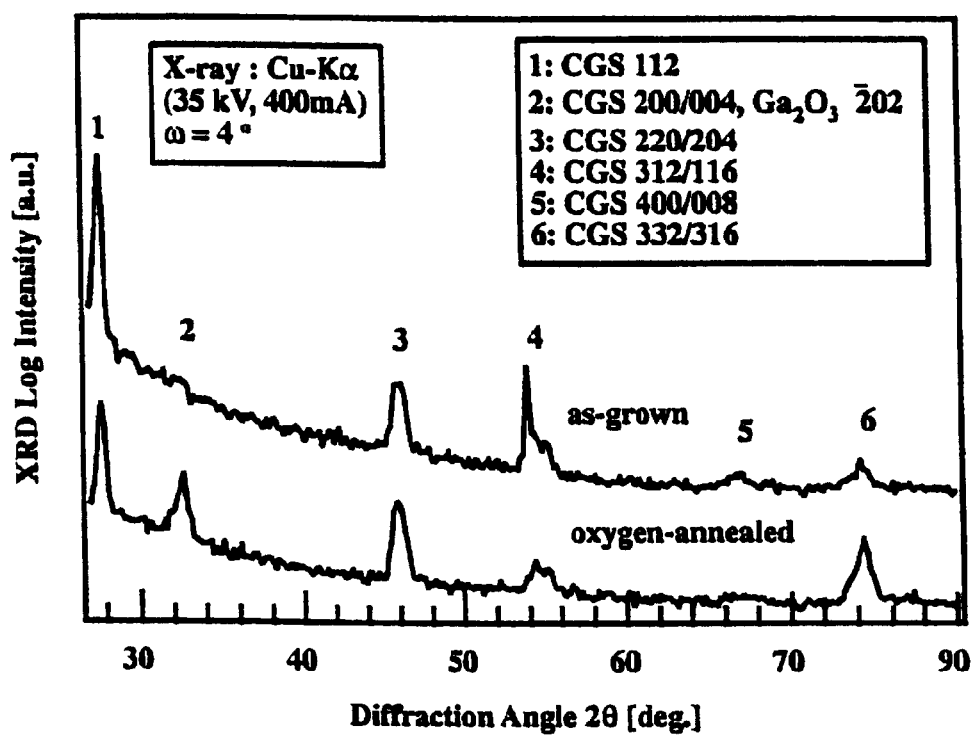
FIG. 2 shows X-ray diffraction patterns of the CGS precursor film before and after annealing.

The X-ray diffraction analysis of a CGS film obtained by annealing the CGS precursor film at 460° C. in the oxygen atmosphere is shown in FIG. 2 together with the as grown precursor film. Diffraction peaks attributed to CGS(008) and CGS(004) are observed in both of the annealed CGS film and its precursor (as grown) film. The most characteristic diffraction peak of gallium oxide (200/004), which is absent in the precursor film, is observed in the case of the annealed film.

Figure 3A:
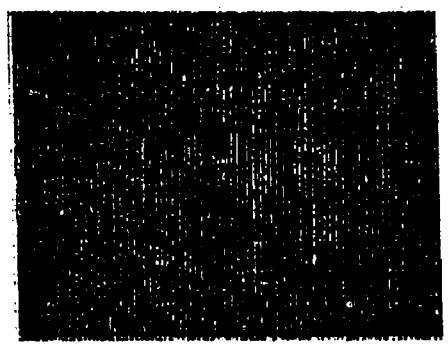
FIG. 3(a) shows scanning electron microphotographs of the CGS precursor film before annealing.
Figure 3B:
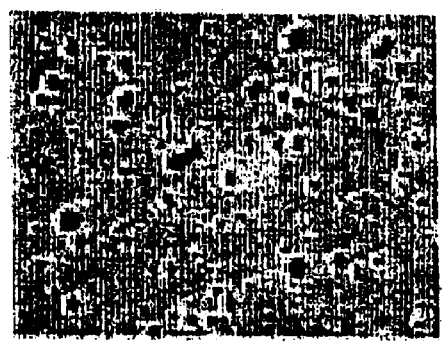
FIG. 3(b) shows scanning electron microphotographs of the CGS precursor film after annealing.

FIGS. 3(a) and 3(b) are scanning electron microphotographs (SEM) of the CGS precursor film before annealing and CGS film annealed at 470° C. A multiplicity of pits are formed in the annealed film. The depth of the pits is about 100 nm.

Figure 4A:
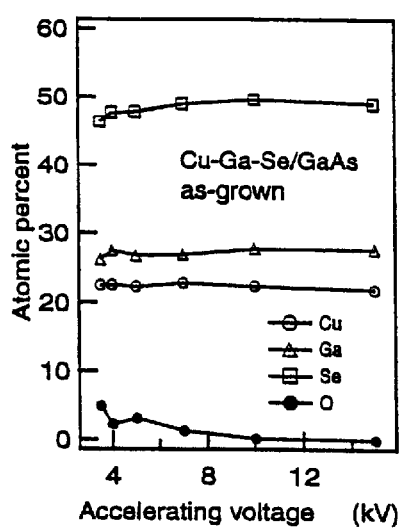
FIG. 4(a) shows results of an electron probe microanalysis of a surface of the CGS precursor film before annealing.
Figure 4B:
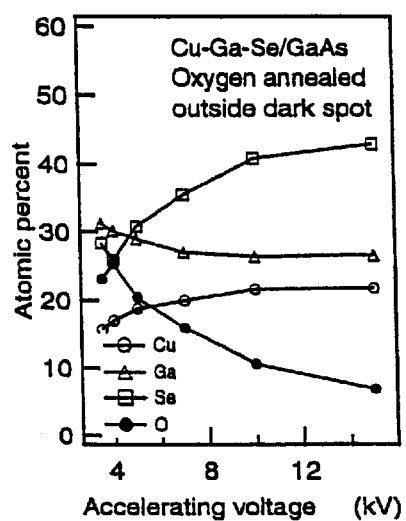
FIG. 4(b) shows results of an electron probe microanalysis of an outside of a pit of the CGS precursor film after annealing.
Figure 4C:
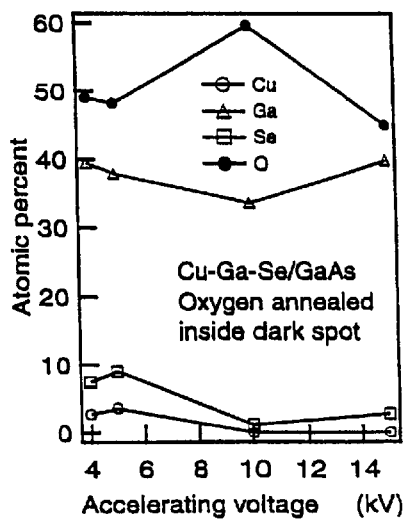
FIG. 4(c) shows results of an electron probe microanalysis of an inside of a pit of the CGS precursor film after annealing.

FIGS. 4(a) through 4(c) show the results of an electron probe microanalysis of a surface of the CGS films before and after the annealing. The analysis was conducted at an electron energy of 3.5–15 kV with probe sizes of 1–50 $\mu$m. As shown in FIG. 4(a), the as grown CGS film before the annealing is found to have uniform composition. FIG. 4(b) shows the results measured for an outside of the pit using a probe size of 50 $\mu$m. The amounts of Ga and O are increased at a surface region while Cu and Se are reduced. A thin gallium oxide film is present on a surface of the annealed CGS film. In the inside of the pit, Ga and O are dominant as shown in FIG. 4(c). The gallium oxide forms a thick layer.

EXAMPLE 3

Figure 6A:
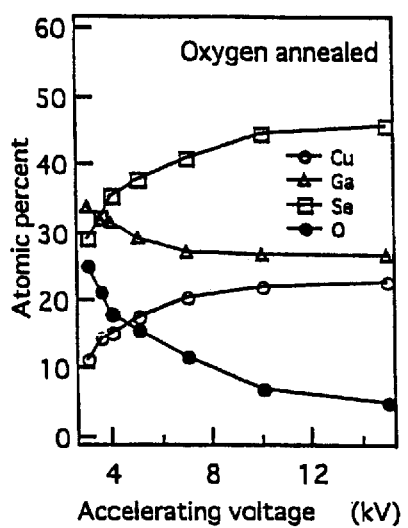
FIG. 6(a) shows results of an electron probe microanalysis of a surface of the CGS precursor film after annealing.
Figure 6B:
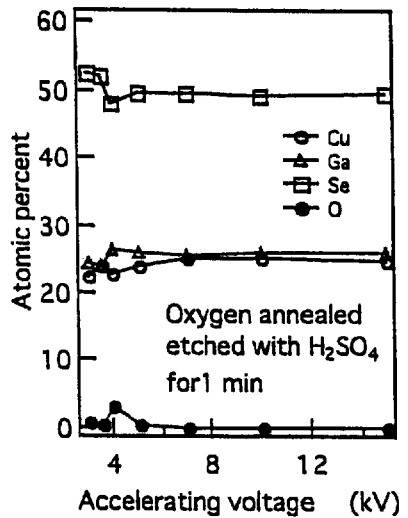
FIG. 6(b) shows results of an electron probe microanalysis of a surface of the CGS film after etching.
Figure 6C:
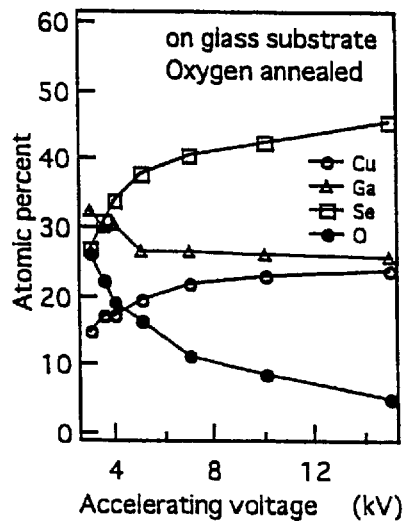
FIG. 6(c) shows results of an electron probe microanalysis of an annealed surface of CGS film formed on a glass substrate.

Etching:

The CGS film obtained by annealing at 460° C. was treated with concentrated sulfuric acid at room temperature for 1 minute. The treated CGS film was found to have a molar ratio of Cu:Ga:Se of 0.98:1.0:2.0. FIG. 6(b) shows results of electron probe microanalysis of a surface of the CGS film after etching. It is seen that the treated CGS film has a uniform composition. The CGS before the etching treatment gives the results of electron probe microanalysis shown in FIG. 6(a). FIG. 6(c) shows results of electron probe microanalysis of as annealed CGS film (without etching) formed on a glass substrate.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A method of producing a semiconductor film of Cu(M$_{III}$)(M$_{VI}$)$_2$ wherein M$_{III}$ represents In$_{1-x}$Ga$_x$ where x is between 0 and 1 and M$_{VI}$ represents Se$_y$S$_{1-y}$ where y is between 0.5 and 1, comprising the steps of:

(a) depositing on a substrate a precursor Cu(M$_{III}$)(M$_{VI}$)$_2$ film having a molar ratio of Cu:M$_{III}$ of less than 1.0:1.0 but not less than 1.0:1.4 and (b) annealing said precursor film at a temperature of 400–500° C. in an oxygen-containing atmosphere to form a buffer layer of indium oxide and/or gallium oxide and a Cu(In$_{1-x}$Ga$_x$)(Se$_y$S$_{1-y}$)$_2$ film interposed between said substrate and said buffer layer.

2. A method as claimed in claim 1, further comprising (c) removing said buffer layer.

3. A method as claimed in claim 2, wherein step (c) is by etching with an inorganic acid.

4. A method as claimed in claim 1, wherein step (a) is by multi-source elemental evaporation or by molecular beam epitaxy.

5. A method as claimed in claim 1, wherein step (a) is performed in the presence of a stoichiometrically excess amount of a gas containing a source of Se.

6. A semiconductor film of CuGa(Se$_y$S$_{1-y}$)$_2$ obtained by a method according to claim 1.

7. A photovoltaic device having a semiconductor film of CuGa(Se$_y$S$_{1-y}$)$_2$ obtained by a method according to claim 1.

* * * * *